(12) United States Patent
Lee et al.

(10) Patent No.: US 10,297,668 B1
(45) Date of Patent: May 21, 2019

(54) VERTICAL TRANSPORT FIN FIELD EFFECT TRANSISTOR WITH ASYMMETRIC CHANNEL PROFILE

(71) Applicant: INTERNATIONAL BUSINESS MACHINES CORPORATION, Armonk, NY (US)

(72) Inventors: Choonghyun Lee, Rensselaer, NY (US); Brent A. Anderson, Jericho, VT (US); Injo Ok, Loudonville, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/876,905

(22) Filed: Jan. 22, 2018

(51) Int. Cl.
*H01L 29/06* (2006.01)
*H01L 29/08* (2006.01)
(Continued)

(52) U.S. Cl.
CPC .. *H01L 29/42376* (2013.01); *H01L 21/28079* (2013.01); *H01L 21/28088* (2013.01); *H01L 21/823437* (2013.01); *H01L 21/823481* (2013.01); *H01L 21/823487* (2013.01); *H01L 27/088* (2013.01); *H01L 29/0649* (2013.01); *H01L 29/0847* (2013.01); *H01L 29/1037* (2013.01); *H01L 29/495* (2013.01); *H01L 29/4966* (2013.01); *H01L 29/6656* (2013.01);
(Continued)

(58) Field of Classification Search
CPC ........... H01L 29/42376; H01L 29/0649; H01L 29/0847; H01L 29/1037; H01L 29/495; H01L 29/4966; H01L 29/6656; H01L 29/66666; H01L 29/7827; H01L 27/088
See application file for complete search history.

(56) References Cited

U.S. PATENT DOCUMENTS 6,744,083 B2  6/2004 Chen et al.
7,285,829 B2  10/2007 Doyle et al.
(Continued)

OTHER PUBLICATIONS

Baek et al., "Device Optimization of N-Channel MOSFETs with Lateral Asymmetric Channel Doping Profiles," Transactions on Electrical and Electronic Materials. vol. 11. No. 1. Feb. 25, 2010. pp. 15-19.
(Continued)

*Primary Examiner* — Ida M Soward
(74) *Attorney, Agent, or Firm* — Tutunjian & Bitetto, P.C.; Vazken Alexanian

(57) ABSTRACT

A method of forming a plurality of vertical fin field effect transistors is provided. The method includes forming a first vertical fin on a first region of a substrate and a second vertical fin on a second region of the substrate, forming an isolation region between the first region and the second region, forming a gate dielectric layer on the vertical fins, forming a first work function layer on the gate dielectric layer, removing an upper portion of the first work function layer from the vertical fin on the first region and the vertical fin on the second region, and forming a second work function layer on the first work function layer and the exposed upper portion of the gate dielectric layer, wherein the first work function layer and second work function layer forms a first combined work function layer with a step in the second work function layer.

10 Claims, 12 Drawing Sheets

(51) Int. Cl.
- *H01L 29/10* (2006.01)
- *H01L 29/49* (2006.01)
- *H01L 29/66* (2006.01)
- *H01L 29/78* (2006.01)
- *H01L 27/08* (2006.01)
- *H01L 29/423* (2006.01)
- *H01L 21/8234* (2006.01)
- *H01L 27/088* (2006.01)
- *H01L 21/28* (2006.01)

(52) U.S. Cl.
CPC .... *H01L 29/66666* (2013.01); *H01L 29/7827* (2013.01)

(56) References Cited

U.S. PATENT DOCUMENTS

| | | | |
|---|---|---|---|
| 8,890,119 B2 | 11/2014 | Doyle et al. | |
| 9,142,660 B2 | 9/2015 | Guo et al. | |
| 9,306,063 B2 | 4/2016 | Doyle et al. | |
| 9,634,132 B2 | 4/2017 | Yu et al. | |
| 9,786,774 B2 | 10/2017 | Colinge et al. | |
| 9,824,936 B2* | 11/2017 | Machkaoutsan | H01L 21/321 |
| 9,899,271 B2* | 2/2018 | Chang | H01L 29/785 |
| 10,014,409 B1* | 7/2018 | Wu | H01L 29/7827 |
| 10,056,289 B1* | 8/2018 | Cheng | H01L 21/764 |
| 2016/0254158 A1* | 9/2016 | Kim | H01L 21/28158 438/591 |
| 2017/0179258 A1 | 6/2017 | Balakrishnan et al. | |
| 2017/0365604 A1* | 12/2017 | Suh | H01L 27/0924 |
| 2018/0122800 A1* | 5/2018 | Cheng | H01L 27/088 |
| 2018/0151680 A1* | 5/2018 | Huang | H01L 21/02126 |
| 2018/0247938 A1* | 8/2018 | Cheng | H01L 27/0924 |
| 2018/0286980 A1* | 10/2018 | Bi | H01L 29/7827 |
| 2018/0294192 A1* | 10/2018 | Bao | H01L 21/82345 |

OTHER PUBLICATIONS

Narasimhulu et al., "Impact of Lateral Asymmetric Channel Doping on Deep Submicrometer Mixed-Signal Device and Circuit Performance," IEEE Transactions on Electron Devices. vol. 50. No. 12. Dec. 2003. pp. 2481-2489.

* cited by examiner

VERTICAL TRANSPORT FIN FIELD EFFECT TRANSISTOR WITH ASYMMETRIC CHANNEL PROFILE

BACKGROUND

Technical Field

The present invention generally relates to vertical transport fin field effect transistors (VT FinFETs) with varying work function metal layer thicknesses to provide asymmetric channel potential transitions, and more particularly to fabrication of VT FinFETs with different work function metal thicknesses of a gate structure to enhance lateral channel electric fields and increase carrier mobility.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a method of forming a plurality of vertical fin field effect transistors is provided. The method includes forming a first vertical fin on a first region of a substrate and a second vertical fin on a second region of the substrate. The method further includes forming an isolation region between the first region and the second region. The method further includes forming a gate dielectric layer on the first vertical fin and the second vertical fin. The method further includes forming a first work function layer on the gate dielectric layer, and removing an upper portion of the first work function layer to expose an upper portion of the gate dielectric layer on the first vertical fin on the first region and the second vertical fin on the second region. The method further includes forming a second work function layer on a remaining portion of the first work function layer and the exposed upper portion of the gate dielectric layer on the first vertical fin on the first region and the second vertical fin on the second region, wherein the remaining portion of the first work function layer and second work function layer forms a first combined work function layer with a step in the second work function layer.

In accordance with another embodiment of the present invention, a plurality of vertical fin field effect transistors is provided. The plurality of vertical fin field effect transistors include a first vertical fin on a first region of a substrate and a second vertical fin on a second region of the substrate, and an isolation region between the first region and the second region. The plurality of vertical fin field effect transistors further include a gate dielectric layer on the first vertical fin and the second vertical fin, a first combined work function layer on a lower portion of the gate dielectric layer on the second vertical fin, and a second work function layer on an upper portion of the gate dielectric layer on the second vertical fin. The plurality of vertical fin field effect transistors further include a second combined work function layer on a lower portion of the gate dielectric layer on the first vertical fin, and a fourth work function layer on an upper portion of the gate dielectric layer on the first vertical fin.

In accordance with yet another embodiment of the present invention, a plurality of vertical fin field effect transistors is provided. The plurality of vertical fin field effect transistors include a first bottom source/drain region on a first region of a substrate and a second bottom source/drain region on a second region of the substrate with an isolation region between the first region and the second region. The plurality of vertical fin field effect transistors further include a first vertical fin on the first region of the substrate and a second vertical fin on the second region of the substrate, and a gate dielectric layer on the first vertical fin and the second vertical fin. The plurality of vertical fin field effect transistors further include a first combined work function layer on a lower portion of the gate dielectric layer on the second vertical fin, and a second work function layer on an upper portion of the gate dielectric layer on the second vertical fin. The plurality of vertical fin field effect transistors further include a second combined work function layer on a lower portion of the gate dielectric layer on the first vertical fin, and a fourth work function layer on an upper portion of the gate dielectric layer on the first vertical fin.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relates generally to forming fin field effect transistors (FinFETs) with an asymmetric channel profile to modify the electric field experienced by charge carriers. A steep potential distribution near the source side of a vertical transport FinFET can enhance the lateral channel electric field and thus increases the carrier mobility.

Embodiments of the present invention relates generally to adjusting the thickness of a work function metal on a vertical fin to modify the electrical potentials, where the work function metal thicknesses can be varied by forming overlapping layers of different heights on a vertical fin. The varying work function metal thicknesses can provide different threshold voltages, while maintaining equal metal gate thicknesses. The varying work function metal thicknesses can be applied to both n-type FinFETs (NFinFETs) and p-type FinFETs (PFinFETs).

Embodiments of the present invention relates generally to altering drain-induced barrier lowering (DIBL), velocity over-shoot, and carrier mobility, while avoiding difficulties inherent with asymmetrical work function metal thicknesses. The work function material thickness can be less on the source side of the VT FinFET and greater on the drain side of the VT FinFET, so a threshold voltage, Vt, can be greater near the source.

Embodiments of the present invention relates generally to modulating the threshold voltage, Vt, of a vertical transport FinFET (VT FinFET) device over a range of about 200 mV by controlling the work function material layer thickness of a gate structure.

Exemplary applications/uses to which the present invention can be applied include, but are not limited to: logic and memory devices utilizing VT FinFETS.

It is to be understood that aspects of the present invention will be described in terms of a given illustrative architecture; however, other architectures, structures, substrate materials and process features and steps can be varied within the scope of aspects of the present invention.

Figure 1:
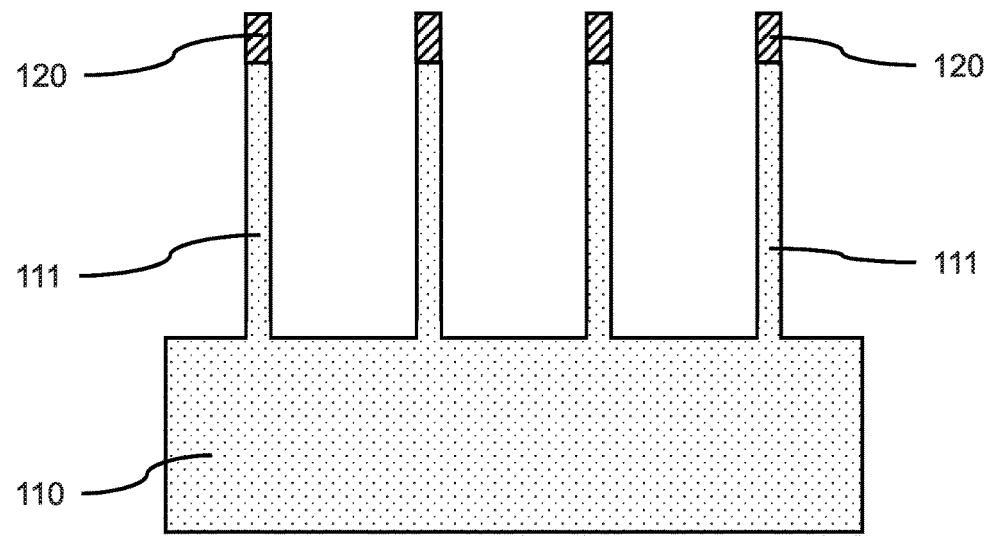
FIG. 1 is a cross-sectional side view showing a plurality of vertical fins on a substrate with a fin template on each vertical fin, in accordance with an embodiment of the present invention.

Referring now to the drawings in which like numerals represent the same or similar elements and initially to FIG. 1, a plurality of vertical fins on a substrate with a fin template on each vertical fin is shown, in accordance with an embodiment of the present invention.

A substrate 110 can be, for example, a single crystal semiconductor material wafer or a semiconductor-on-insulator stacked wafer. The substrate can include a support layer that provides structural support, and an active semiconductor layer that can form devices. An insulating layer may be between the active semiconductor layer and the support layer to form a semiconductor-on-insulator substrate (SeOI) (e.g., a silicon-on-insulator substrate (SOI)).

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g. silica, borosilicate glass), ceramic (e.g., aluminum oxide ($Al_2O_3$, sapphire), plastic (e.g., polycarbonate, polyacetonitrile), metal (e.g. aluminum, gold, titanium, molybdenum-copper (MoCu) composites, etc.), or combination thereof.

The active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)).

The insulating layer can be, for example, a buried oxide (BOX) layer (e.g., $SiO_2$) or an implanted layer forming a buried insulating material.

In one or more embodiments, a plurality of vertical fins 111 can be formed on the substrate 110, where the vertical fins can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins may be formed by a direct write process or double patterning process using, for example, immersion lithography, extreme ultraviolet lithography, or x-ray lithography.

In various embodiments, a fin template 120 may be on each vertical fin 111, where the fin template 120 is formed during the patterning process. The fin templates 120 can be a hardmask, for example, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. A thin (i.e., <1 nm) oxide layer can be between the top surface of the vertical fin 111 and the fin template 120.

Figure 2:
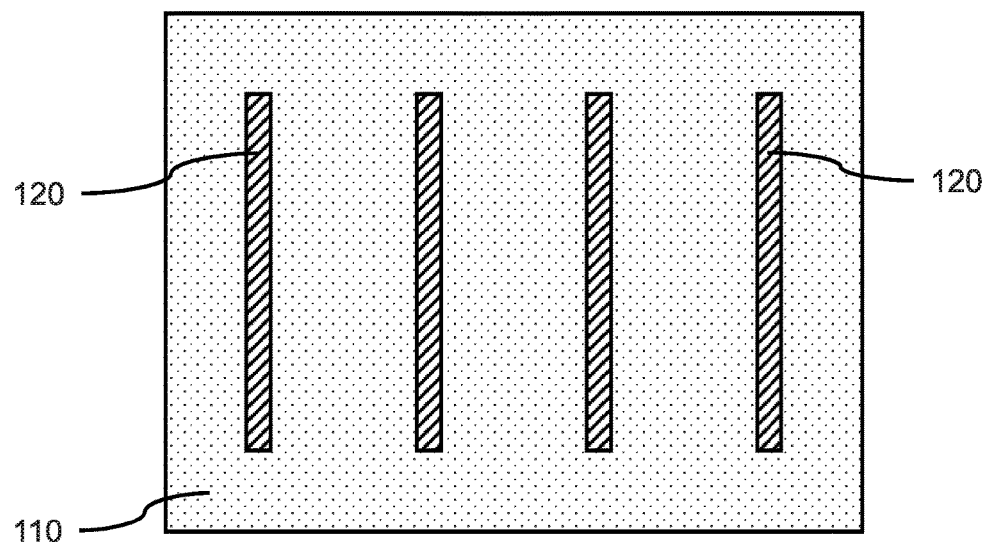
FIG. 2 is a top view showing a plurality of vertical fins on a substrate with a fin template on each vertical fin, in accordance with an embodiment of the present invention.

FIG. 2 is a top view showing a plurality of vertical fins on a substrate with a fin template on each vertical fin, in accordance with an embodiment of the present invention.

In one or more embodiments, the vertical fins can have a length in the range of about 20 nm to about 200 nm, or in the range of about 20 nm to about 100 nm, or in the range of about 20 nm to about 80 nm, although other lengths are contemplated.

In one or more embodiments, an adjacent pair of vertical fins 111 can be separated by a fin pitch in the range of about 30 nm to about 100 nm, or in the range of about 40 nm to about 75 nm, or in the range of about 40 nm to about 50 nm, although other fin pitches are also contemplated.

Figure 3:
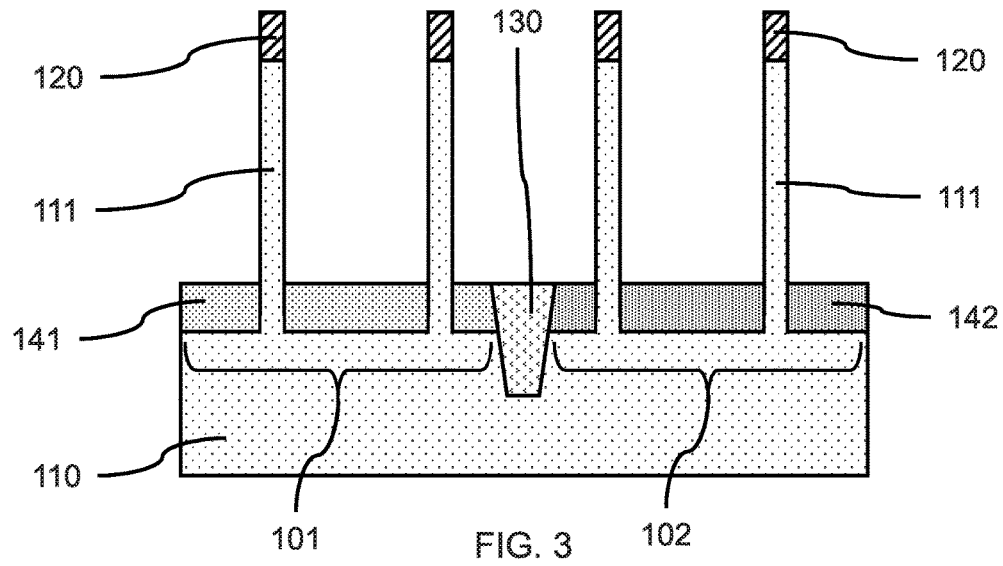
FIG. 3 is a cross-sectional side view showing an isolation region separating the plurality of vertical fins, and a bottom drain region on opposite sides of the isolation region, in accordance with an embodiment of the present invention.

FIG. 3 is a cross-sectional side view showing an isolation region separating the plurality of vertical fins, and a bottom drain region on opposite sides of the isolation region, in accordance with an embodiment of the present invention.

In one or more embodiments, a first bottom source/drain region 141 can be formed on a first region 101 of the substrate 110, and a second bottom source/drain region 142 can be formed on a second region 102 of the substrate 110, where the bottom source/drain regions 141, 142 can be formed by epitaxial growth on the substrate. The first bottom source/drain region 141 can be on a lower portion of a subset of vertical fins 111 formed on the first region 101, and the second bottom source/drain region 142 can be on a lower portion of a subset of vertical fins 111 formed on the second region 102.

Dopants (n-type or p-type) can be incorporated in-situ (i.e., during epitaxial growth) or ex-situ (i.e., after epitaxial growth or into the substrate) by suitable doping techniques, including but not limited to, ion implantation, gas phase doping, plasma doping, plasma immersion ion implantation, cluster doping, infusion doping, liquid phase doping, solid phase doping, etc. In various embodiments, the bottom source/drain region 141 can be doped to form n-type or p-type source/drains to fabricate NFETs or PFETs. The dopant forming the bottom source/drain region 142 can be the opposite type as the bottom source/drain region 141 in the first region 101, such that complementary doped device can be formed adjacent to each other on the substrate 110.

In one or more embodiments, p-type dopants can include, but not be limited to, boron (B), aluminum (Al), gallium (Ga), and indium (In). N-type dopants can include, but not be limited to, phosphorus (P), arsenic (s), and antimony (Sb). In various embodiments, phosphorus (P) doped silicon can be used as the bottom source/drain region 141 for NFETs. In various embodiments, boron (B) doped silicon can be used as the bottom source/drain region 142 for PFETs. In various embodiments the dopants can be reversed, such that a p-type bottom source/drain region 141 can be formed in the first region, and an n-type bottom source/drain region can be formed in the second region. A vertical fin 111 can be directly on a bottom source/drain region 141, 142.

In one or more embodiments, a trench can be formed in the substrate 110 and bottom source/drain regions 141, 142 to form an isolation region 130, where the isolation region can be filled with an insulating, dielectric material, for example, silicon oxide (SiO), silicon nitride (SiN), a low-k dielectric material, or combinations thereof. A low-K dielectric can include amorphous carbon (a-C), fluorine doped silicon oxide (SiO:F), carbon doped silicon oxide (SiO:C), SiCOH, silicon boro carbonitride (SiBCN), or a combination thereof.

In one or more embodiments, an isolation region 130 (e.g., a shallow trench isolation (STI) region) can be formed in the substrate 110, where the isolation region can prevent or reduce electrical conduction between different regions of the substrate 110. The isolation region 130 can have a width of at least 50 nm, or at least 100 nm or about 50 nm to about 250 nm, or about 100 nm to about 150 nm, to physically and electrically separate adjacent regions of the substrate 110. One or more vertical fins 111 can be formed on each side of the isolation region 130, wherein the isolation region 130 separates the substrate into two different regions, for example, a first region 101 and a second region 102. One or more vertical fins 111 formed in the first region 101 can be configured to form an n-type fin field effect transistor (FinFET), and one or more vertical fins 111 formed in the second region 102 can be configured to form a p-type FinFET, although the arrangement and/or dopant type can be reversed.

Figure 4:
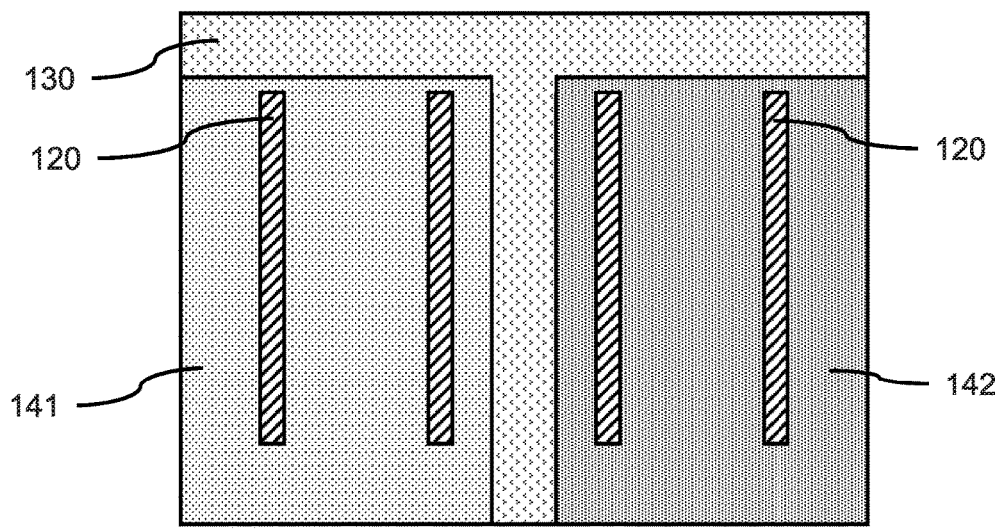
FIG. 4 is a top view showing the T-shaped isolation region separating a first subset of vertical fins from a second subset of vertical fins and an n-type bottom drain region from a p-type drain region on the substrate, in accordance with an embodiment of the present invention.

FIG. 4 is a top view showing the T-shaped isolation region separating a first subset of vertical fins from a second subset of vertical fins and an n-type bottom drain region from a p-type drain region on the substrate, in accordance with an embodiment of the present invention.

In one or more embodiments, the trench and isolation region 130 can be T-shaped, where the isolation region separates two neighboring bottom source/drain regions 141, 142 and borders the bottom source/drain regions 141, 142 on one other side spanning the two bottom source/drain regions. In various embodiments, the isolation region 130 can boarder the bottom source/drain regions 141, 142 on three sides or encircle each of the bottom source/drain regions 141, 142, where the isolation region separates two neighboring bottom source/drain regions along a common border.

Figure 5:
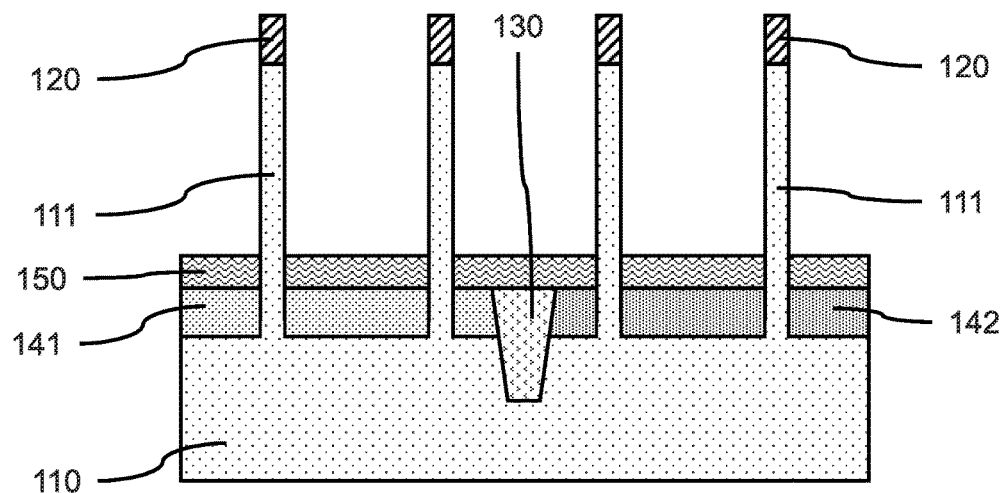
FIG. 5 is a cross-sectional side view showing a bottom spacer layer on the isolation region and bottom drain regions, in accordance with an embodiment of the present invention.

FIG. 5 is a cross-sectional side view showing a bottom spacer layer on the isolation region and bottom drain regions, in accordance with an embodiment of the present invention.

In one or more embodiments, a bottom spacer layer 150 can be formed on the surface of the substrate 110, the bottom source/drain regions 141, 142, and the isolation region 130, as well as on a lower portion of the vertical fins 111 in both the first and second regions 101, 102.

In various embodiments, the bottom spacer layer 150 can be formed by a directional deposition, for example, a high density plasma chemical vapor deposition (HDPCVD), physical vapor deposition (PVD), or gas cluster ion beam (GCIB), or a blanket deposition and etch-back. In embodiments that use PVD, a sputtering apparatus may include direct-current diode systems, radio frequency sputtering, magnetron sputtering, or ionized metal plasma sputtering. In embodiments that use GCIB deposition, a high-pressure gas is allowed to expand in a vacuum, subsequently condensing into clusters. The clusters can be ionized and directed onto a surface, providing a highly anisotropic deposition.

In various embodiments, the material of the bottom spacer layer 150 can be a dielectric material including, but not be limited to, silicon oxide (SiO), silicon nitride (SiN), a silicon oxynitride (SiON), a silicon carbonitride (SiCN), a silicon boronitride (SiBN), a silicon borocarbide (SiBC), a low-K dielectric, or combinations thereof. Other examples include, Applied Material's Black Diamond™.

In various embodiments, the bottom spacer layer 150 can have a thickness in the range of about 3 nm to about 15 nm, or in the range of about 5 nm to about 10 nm, or about 3 nm to about 5 nm, although other thicknesses are contemplated.

Figure 6:
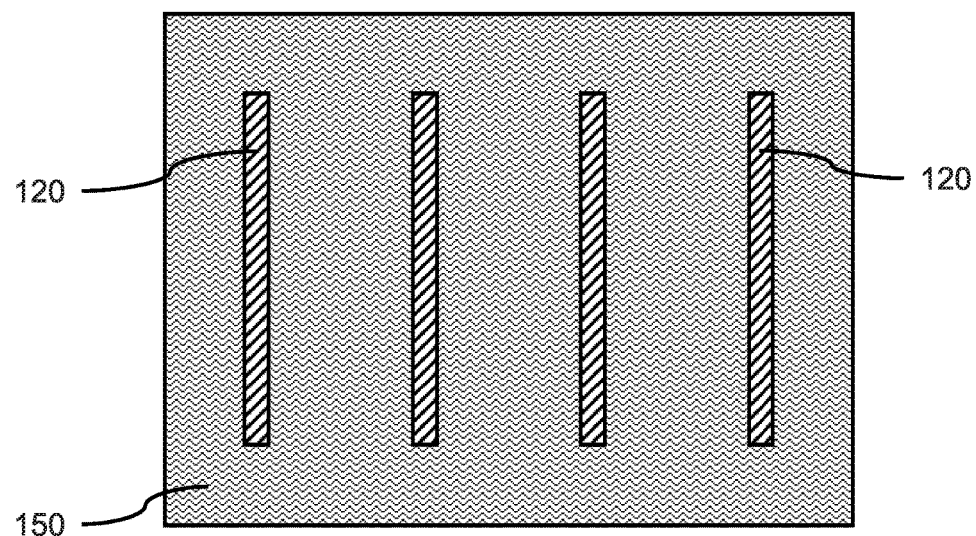
FIG. 6 is a top view showing bottom spacer layer on the T-shaped isolation region and bottom drain regions, in accordance with an embodiment of the present invention.

FIG. 6 is a top view showing bottom spacer layer on the T-shaped isolation region and bottom drain regions, in accordance with an embodiment of the present invention.

In various embodiments, the bottom spacer layer 150 can surround the vertical fins 111 on both the first region 101 and the second region 102.

Figure 7:
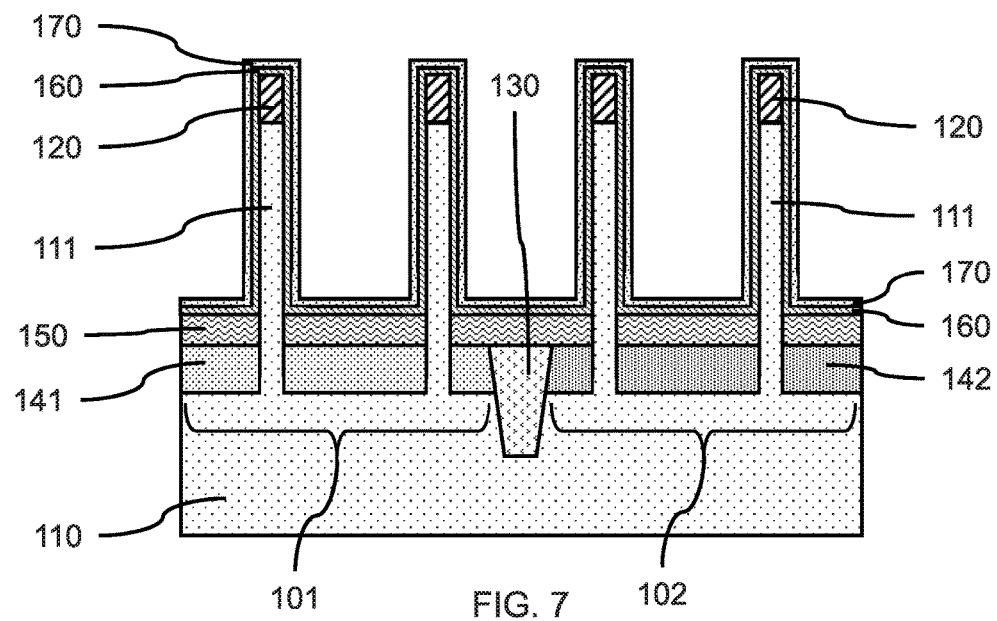
FIG. 7 is a cross-sectional side view showing a gate dielectric layer on the bottom spacer layer, and a first work function layer on the gate dielectric layer, in accordance with an embodiment of the present invention.

FIG. 7 is a cross-sectional side view showing a gate dielectric layer on the bottom spacer layer, and a first work function layer on the gate dielectric layer, in accordance with an embodiment of the present invention.

In one or more embodiments, a gate dielectric layer 160 can be formed on the exposed portions of the vertical fins 111 and fin templates 120, and the exposed surface of the bottom spacer layer 150. The gate dielectric layer 160 can be formed by a conformal deposition (e.g., atomic layer deposition (ALD), plasma enhanced ALD (PEALD)).

In one or more embodiments, a gate dielectric layer 160 can be silicon oxide (SiO), silicon nitride (SiN), silicon oxynitride (SiON), boron nitride (BN), high-k dielectric materials, or a combination thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 160 can have a thickness in the range of about 7 Å to about 30 Å, or about 7 Å to about 10 Å, or about 1 nm to about 2 nm, although other thicknesses are contemplated.

In one or more embodiments, a work function material (WFM) can form a first work function layer 170 on the gate dielectric layer 160. The first work function layer 170 can be deposited on the gate dielectric layer 160 by a conformal deposition (e.g., atomic layer deposition (ALD), plasma enhanced ALD (PEALD), chemical vapor deposition (CVD), plasma enhanced CVD (PECVD), or a combination thereof, to a predetermined thickness.

In various embodiments, the first work function layer 170 can include, but not necessarily be limited to, titanium nitride (TiN), tantalum nitride (TaN) or ruthenium (Ru), for a PFET. The work function layer 170 can include, but not necessarily be limited to, titanium nitride (TiN), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN), lanthanum (La) doped TiN or lanthanum (La) doped TaN, for an NFET.

The first work function layer 170 can have a thickness in the range of about 1 nm to about 10 nm, or about 2 nm to about 5 nm, or about 1 nm to about 3 nm, or about 2 nm, although other thicknesses are contemplated.

The gate dielectric layer 160 and first work function layer 170 can cover the sidewalls and endwalls of the vertical fins 111 on both the first region 101 and the second region 102.

Figure 8:
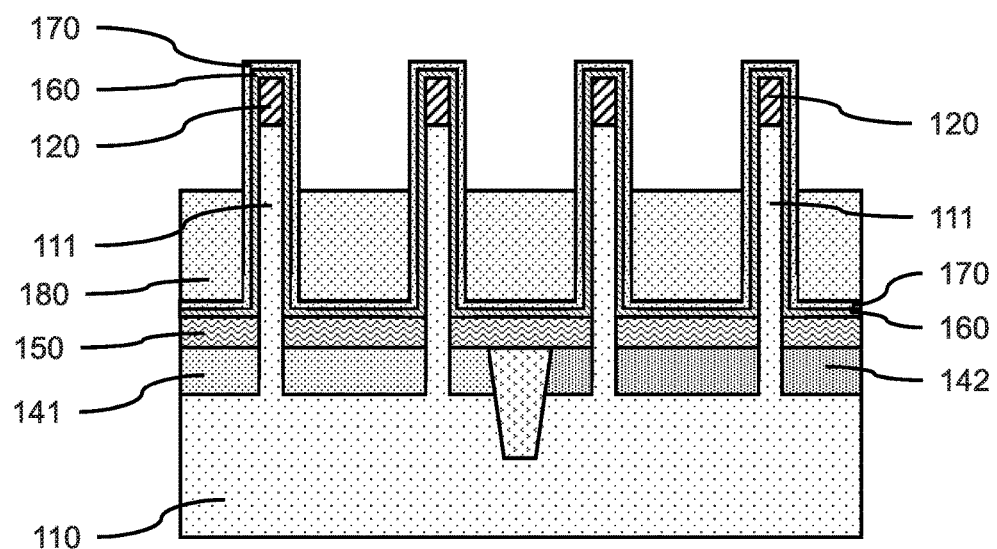
FIG. 8 is a cross-sectional side view showing a cover layer with a reduced height on the work function layer and gate dielectric layer, in accordance with an embodiment of the present invention.

FIG. 8 is a cross-sectional side view showing a cover layer with a reduced height on the work function layer and gate dielectric layer, in accordance with an embodiment of the present invention.

In one or more embodiments, a cover layer 180 can be formed on the work function layer and gate dielectric layer on the vertical fins on both the first region 101 and the second region 102, where the cover layer 180 can be formed by a blanket deposition (e.g., CVD, spin-on). The cover layer can extend above the top surface of the fin templates 120, and a chemical mechanical polishing (CMP) used to reduce the height and provide a planarized surface.

In various embodiments, the cover layer 180 can be a soft mask material, for example, an organic planarization layer or lithography resist material, such as a polymeric material (e.g. poly(methyl methacrylate) (PMMA), siloxanes, polydimethylsiloxane (PDMS), hydrogen silsesquioxane (HSQ), tetraethyl orthosilicate (TEOS), etc.) or amorphous carbon (a-C).

In various embodiments, the cover layer 180 can be a hard mask comprising a dielectric material such as silicon nitride (SiN), silicon oxide (SiO), a silicon oxynitride (SiON), a silicon carbide (SiC), a silicon oxygen carbonitride (SiOCN), or a silicoboron carbonitride (SiBCN). The cover layer 180 can also be a combination of a hardmask and softmask, for example, a bilayer.

In various embodiments, the cover layer 180 can be etched back, for example, by a directional etch (e.g., reactive ion etch (RIE)) to a predetermined depth to exposed a predetermined portion of the gate dielectric layer 160 and first work function layer 170.

Figure 9:
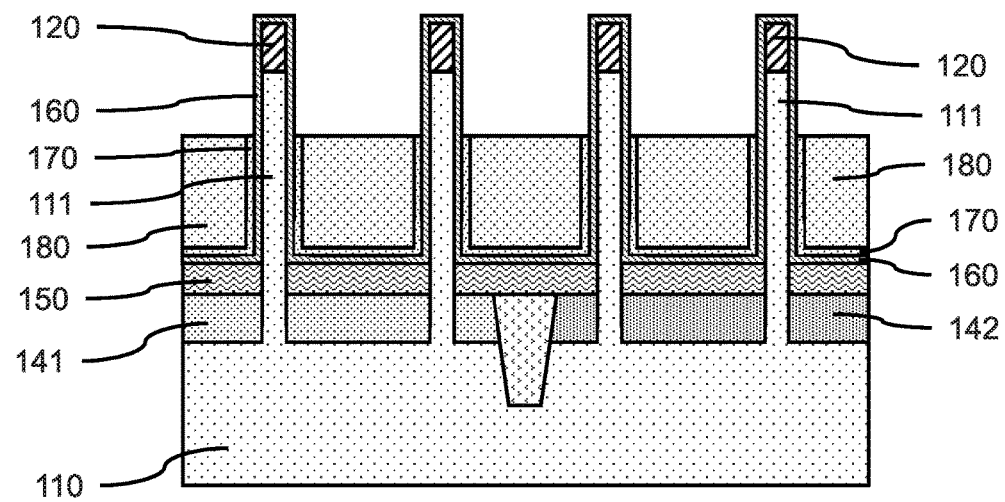
FIG. 9 is a cross-sectional side view showing the first work function layer with a reduced height, in accordance with an embodiment of the present invention.

FIG. 9 is a cross-sectional side view showing the first work function layer with a reduced height, in accordance with an embodiment of the present invention.

In one or more embodiments, the exposed portion of the first work function layer 170 can be removed from the vertical fins 111 on the first region 101 and the second region 102. The first work function layer 170 can be removed using a selective wet chemical etch, for example, an SC1 etch known in the art can be used to remove a TiN work function layer. Removal of the exposed portion of the first work function layer 170 can expose the underlying portion of the gate dielectric layer 160, which can act as an etch-stop layer.

In various embodiments, the height of the cover layer 180 can be reduced to expose about 10% to about 40% of the vertical fin height covered by the gate dielectric layer 160 and first work function layer 170. Removal of the first work function layer 170 can expose about 10% to about 40% of the vertical fin height covered by the gate dielectric layer 160.

Figure 10:
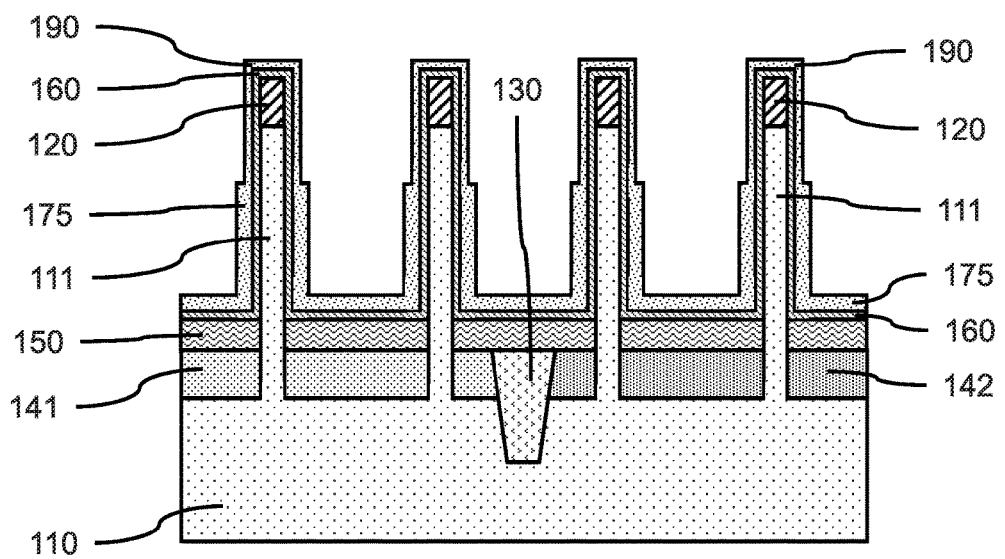
FIG. 10 is a cross-sectional side view showing a second work function layer on the first work function layer, where the first work function layer forms a step in the second work function layer, in accordance with an embodiment of the present invention.

FIG. 10 is a cross-sectional side view showing a second work function layer on the first work function layer, where the first work function layer forms a step in the second work function layer, in accordance with an embodiment of the present invention.

In one or more embodiments, the cover layer 180 can be removed to expose the remaining portion of the first work function layer 170 on the vertical fins 111 on the first region 101 and the second region 102, where the cover layer can be removed using a selective wet or dry chemical etch.

In one or more embodiments, a work function material (WFM) can form a second work function layer 190 on the exposed portion of the gate dielectric layer 160 and the remaining portion of the first work function layer 170. The second work function layer 190 can be selected from the same materials as the first work function layer 170, and the second work function layer 190 can be the same material as the first work function layer 170. The first work function layer 170 and second work function layer 190 made of the same material can form a first combined work function layer 175 on the lower portion of the vertical fins 111 and horizontal surface of the gate dielectric layer 160 in the first and second regions 101, 102. Formation of the second work function layer 190 on the exposed gate dielectric layer 160 and first work function layer 170 can form a step between the first work function layer 170 on the lower portion of the vertical fins 111 and the upper portion of the vertical fins only covered by the gate dielectric layer 160. The first combined work function layer 175 can have a thickness equal to the sum of the first work function layer 170 and the second work function layer 190.

The second work function layer 190 can be formed by a conformal deposition (e.g., atomic layer deposition (ALD), plasma enhanced ALD (PEALD), chemical vapor deposition (CVD), plasma enhanced CVD (PECVD), or a combination thereof, to a predetermined thickness.

In various embodiments, the second work function layer 190 can have a thickness in the range of about 1 nm to about 10 nm, or about 2 nm to about 5 nm, or about 1 nm to about 3 nm, or about 2 nm, although other thicknesses are contemplated.

Figure 11:
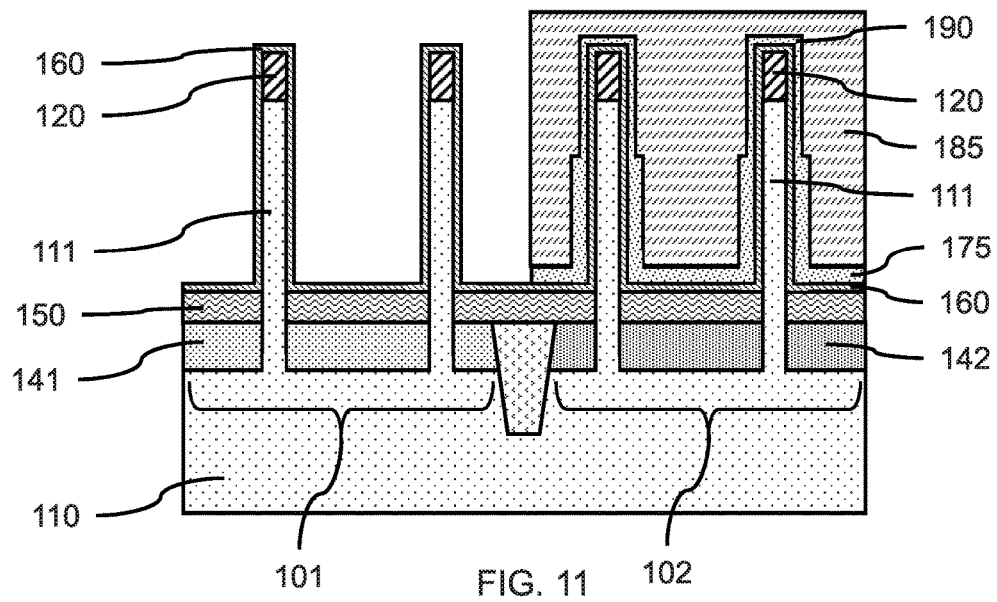
FIG. 11 is a cross-sectional side view showing a masking block on the combination of the second work function layer and first work function layer on the vertical fins in the second region, and an exposed gate dielectric layer on the vertical fins in the first region, in accordance with an embodiment of the present invention.

FIG. 11 is a cross-sectional side view showing a masking block on the combination of the second work function layer and first work function layer on the vertical fins in the second region, and an exposed gate dielectric layer on the vertical fins in the first region, in accordance with an embodiment of the present invention.

In one or more embodiments, a masking layer can be formed on the second work function layer 190 and first combined work function layer 175, and patterned and etched to form a masking block 185 on the vertical fins 111 on the second region 102 of the substrate. The masking block 185 can be a softmask, a hardmask, or a combination thereof. Formation of the masking block 185 can expose the second work function layer 190 and first combined work function layer 175 on the vertical fins 111 on the first region 101.

In one or more embodiments, the exposed second work function layer 190 and first combined work function layer 175 on the vertical fins 111 on the first region 101 can be removed using a selectable wet chemical etch to expose the gate dielectric layer 160. The second work function layer 190 and first combined work function layer 175 on the vertical fins 111 on the second region 102 can remain on the gate dielectric layer 160 and vertical fins on the second region 102.

Figure 12:
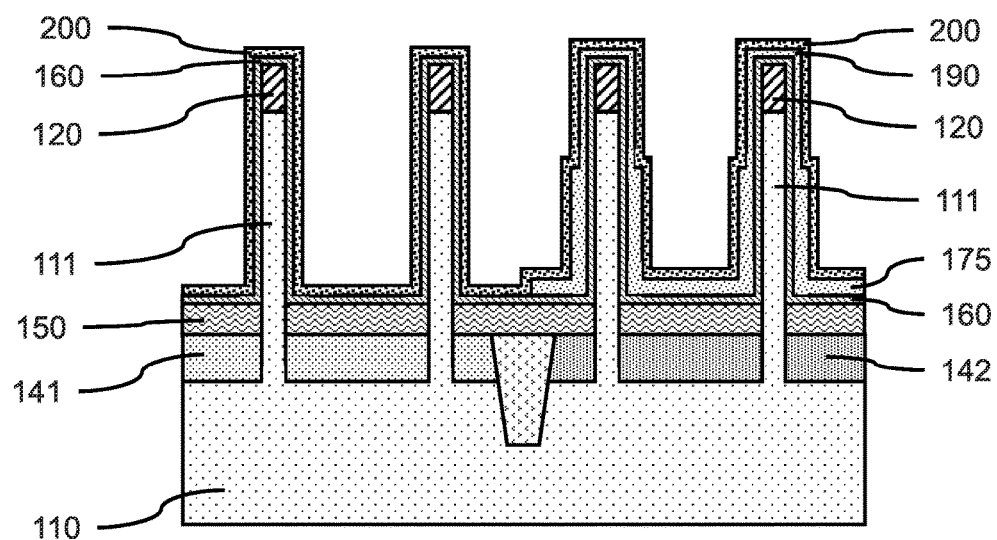
FIG. 12 is a cross-sectional side view showing a third work function layer on the gate dielectric layer on the vertical fins in the first region, and on the second work function layer and first combined work function layer on the vertical fins in the second region, in accordance with an embodiment of the present invention.

FIG. 12 is a cross-sectional side view showing a third work function layer on the gate dielectric layer on the vertical fins in the first region, and on the second work function layer and first combined work function layer on the vertical fins in the second region, in accordance with an embodiment of the present invention.

In various embodiments, the masking block 185 can be removed to expose the underlying second work function layer 190 and first combined work function layer 175 on the vertical fins 111 on the second region 102. The masking block 185 can be removed using a selective wet or dry chemical etch.

In one or more embodiments, a third work function layer 200 can be formed on the gate dielectric layer 160 on the vertical fins 111 on the first region 101 and the second work function layer 190 and first combined work function layer 175 on the vertical fins 111 on the second region 102. The third work function layer 200 can be formed by a conformal deposition (e.g., atomic layer deposition (ALD), plasma enhanced ALD (PEALD), chemical vapor deposition (CVD), plasma enhanced CVD (PECVD), or a combination thereof, to a predetermined thickness.

In various embodiments, the third work function layer 200 can have a thickness in the range of about 1 nm to about 10 nm, or about 3 nm to about 7 nm, or about 4 nm to about 6 nm, or about 4 nm, although other thicknesses are contemplated.

In various embodiments, the third work function layer 200 can include, but not necessarily be limited to, titanium nitride (TiN), tantalum nitride (TaN) or ruthenium (Ru), for a PFET. The third work function layer 200 can include, but not necessarily be limited to, titanium nitride (TiN), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN, for an NFET. The material of the third work function layer 200 can be of the type opposite the second work function layer 190 and first combined work function layer 175, so an NFET can be formed on one region of the substrate and a PFET can be formed on the other region of the substrate. In various embodiments, an n-type work function material can be formed on the vertical fins 111 having the p-type bottom source/drain region 141, and a p-type second work function layer 190 and first combined work function layer 175 can be formed on the vertical fins having the n-type bottom source/drain region 142. The third work function layer 200 may not affect the work function properties of second work function layer 190 and first combined work function layer 175 if the second work function layer 190 or first combined work function layer 175 is sufficiently thick (e.g., >4 nm).

In various embodiments, formation of the third work function layer 200 can increase the size of the step on the vertical fins on the second region 102.

Figure 13:
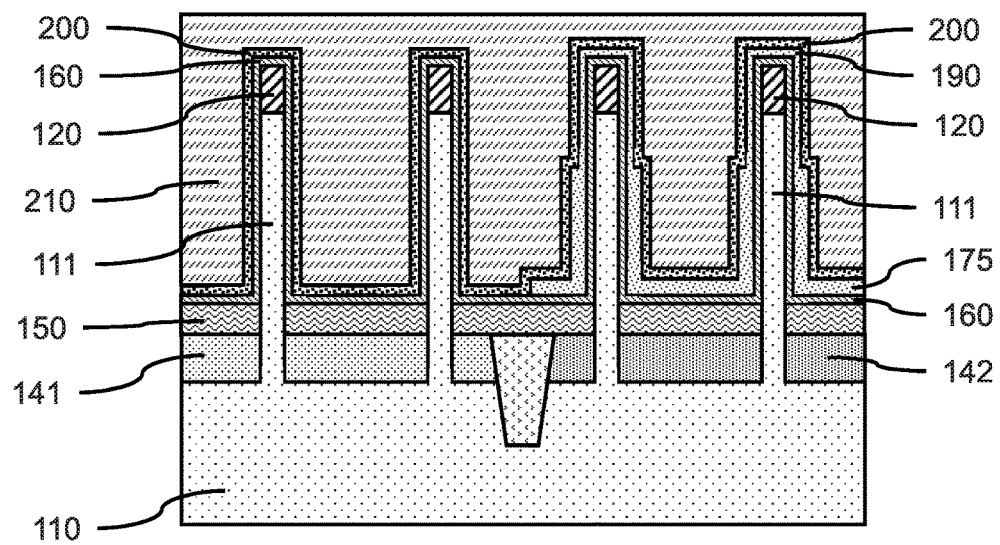
FIG. 13 is a cross-sectional side view showing a second cover layer on the third work function layer in the first region, and on the third work function layer in the second region, in accordance with an embodiment of the present invention.

FIG. 13 is a cross-sectional side view showing a second cover layer on the third work function layer in the first region, and on the third work function layer in the second region, in accordance with an embodiment of the present invention.

In one or more embodiments, a second cover layer 210 can be formed on the third work function layer 200 on the vertical fins on both the first region 101 and the second region 102, where the cover layer 210 can be formed by a blanket deposition (e.g., CVD, spin-on). The cover layer can extend above the top surface of the fin templates 120, and a chemical mechanical polishing (CMP) used to reduce the height and provide a planarized surface. The second cover layer 210 can be a softmask, a hardmask, or a combination thereof.

Figure 14:
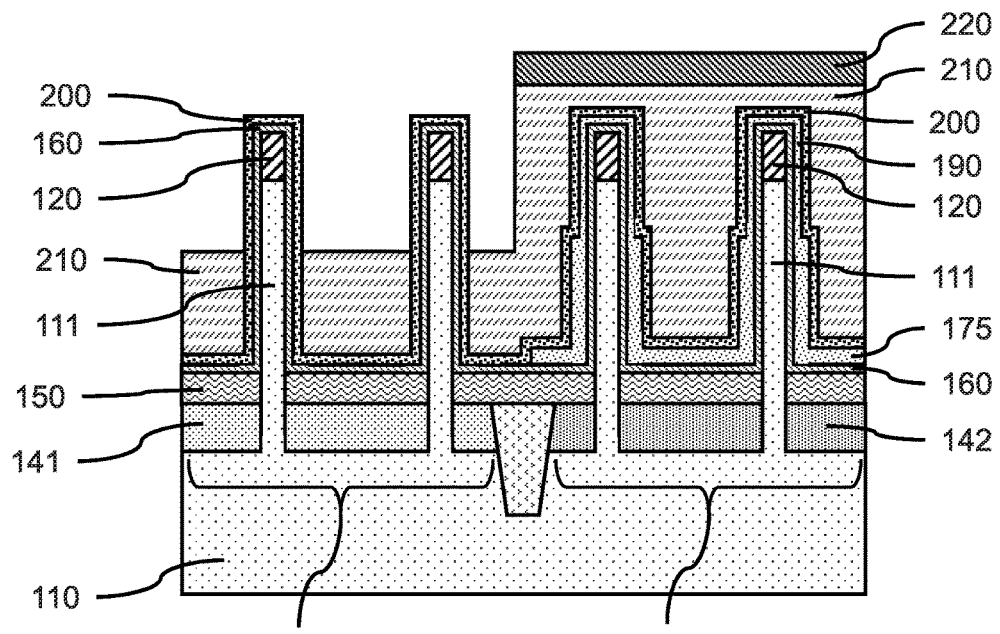
FIG. 14 is a cross-sectional side view showing a cover layer with a reduced height in the first region exposing a portion of the third work function layer, in accordance with an embodiment of the present invention.

FIG. 14 is a cross-sectional side view showing a cover layer with a reduced height in the first region exposing a portion of the third work function layer, in accordance with an embodiment of the present invention.

In one or more embodiments, the height of the second cover layer 210 can be reduced in the first region 101 to expose and upper portion of the third work function layer 200, where the height of the second cover layer 210 can be reduced using a suitable masking layer 220 and a directional etch (e.g., RIE). In various embodiments, the height of the second cover layer 210 can be reduced to expose about 10% to about 40% of the vertical fin height covered by the gate dielectric layer 160 and the third work function layer 200.

Figure 15:
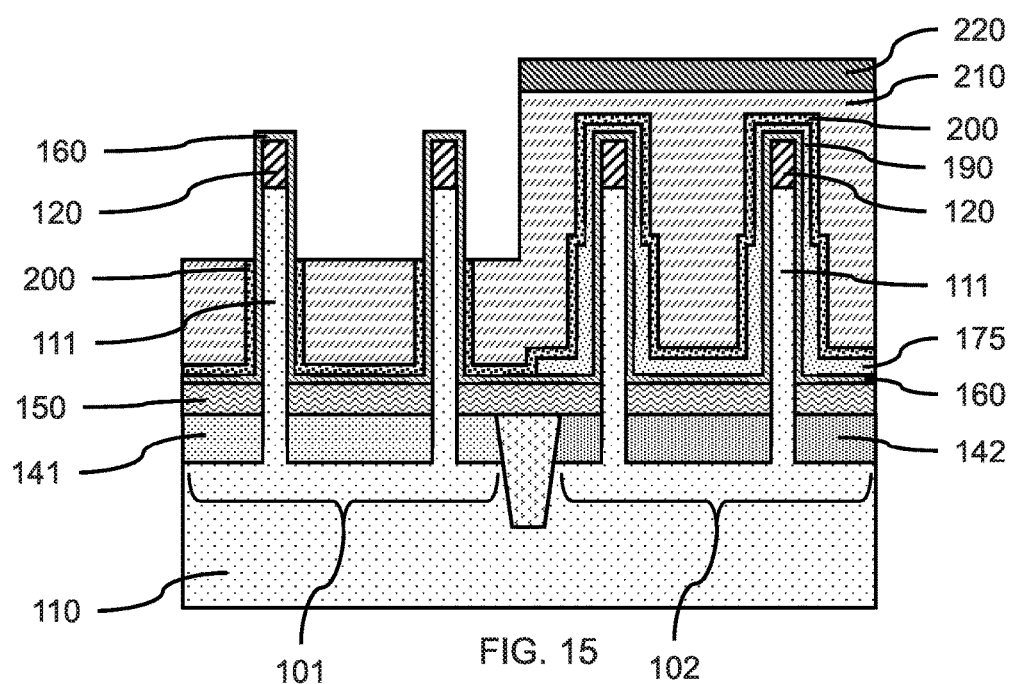
FIG. 15 is a cross-sectional side view showing the third work function layer with a reduced height in the first region, in accordance with an embodiment of the present invention.

FIG. 15 is a cross-sectional side view showing the third work function layer with a reduced height in the first region, in accordance with an embodiment of the present invention.

Removal of the exposed portion of the third work function layer 200 can expose about 10% to about 40% of the vertical fin height covered by the gate dielectric layer 160, where the exposed portion of the third work function layer can be removed by a selective wet or dry chemical etch. The height reduction of the third work function layer 200 can be the same as the reduction in height of the first work function layer 170, or the reduction in height of the third work function layer 200 can be different from the reduction in height of the first work function layer 170.

Figure 16:
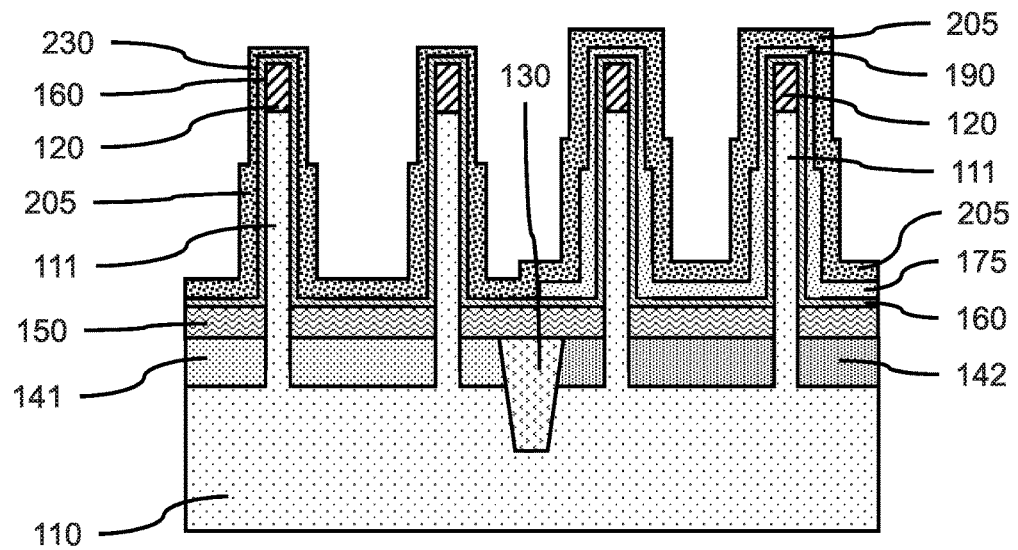
FIG. 16 is a cross-sectional side view showing a fourth work function layer on the third work function layer on the vertical fins in the first region and second region, where the third work function layer forms a step in the fourth work function layer, in accordance with an embodiment of the present invention.

FIG. 16 is a cross-sectional side view showing a fourth work function layer on the third work function layer on the vertical fins in the first region and second region, where the third work function layer forms a step in the fourth work function layer, in accordance with an embodiment of the present invention.

In one or more embodiments, the second cover layer 210 can be removed to expose the third work function layer 200 on the vertical fins 111 in the second region 102 and the gate dielectric layer 160 and third work function layer 200 on the vertical fins 111 in the first region 101.

In one or more embodiments, a fourth work function layer 230 can be formed on the exposed portion of the gate dielectric layer 160 and the remaining portion of the third work function layer 200. The fourth work function layer 230 can be selected from the same materials as the third work function layer 200, and the fourth work function layer 230 can be the same material as the third work function layer 200. The fourth work function layer 230 and third work function layer 200 made of the same material can form a second combined work function layer 205 on the lower portion of the vertical fins 111 and horizontal surface of the gate dielectric layer 160 in the first regions 101. Formation of the fourth work function layer 230 on the exposed gate dielectric layer 160 and third work function layer 200 can form a step between the third work function layer 200 on the lower portion of the vertical fins 111 and the upper portion of the vertical fins only covered by the gate dielectric layer 160. The second combined work function layer 205 can have a thickness equal to the sum of the third work function layer 200 and the fourth work function layer 230.

In the second region, the fourth work function layer 230 can be formed on the third work function layer 200 over the vertical fins 111, so the entire vertical fin in the second region can be covered by a second combined work function layer 205.

The fourth work function layer 230 can be formed by a conformal deposition (e.g., atomic layer deposition (ALD), plasma enhanced ALD (PEALD), chemical vapor deposition (CVD), plasma enhanced CVD (PECVD), or a combination thereof, to a predetermined thickness.

In various embodiments, the fourth work function layer 230 can have a thickness in the range of about 1 nm to about 10 nm, or about 2 nm to about 5 nm, or about 1 nm to about 3 nm, or about 2 nm, although other thicknesses are contemplated.

In various embodiments, a step between the first combined work function layer 175 and the second combined work function layer 205 can be formed over the isolation region 130.

Figure 17:
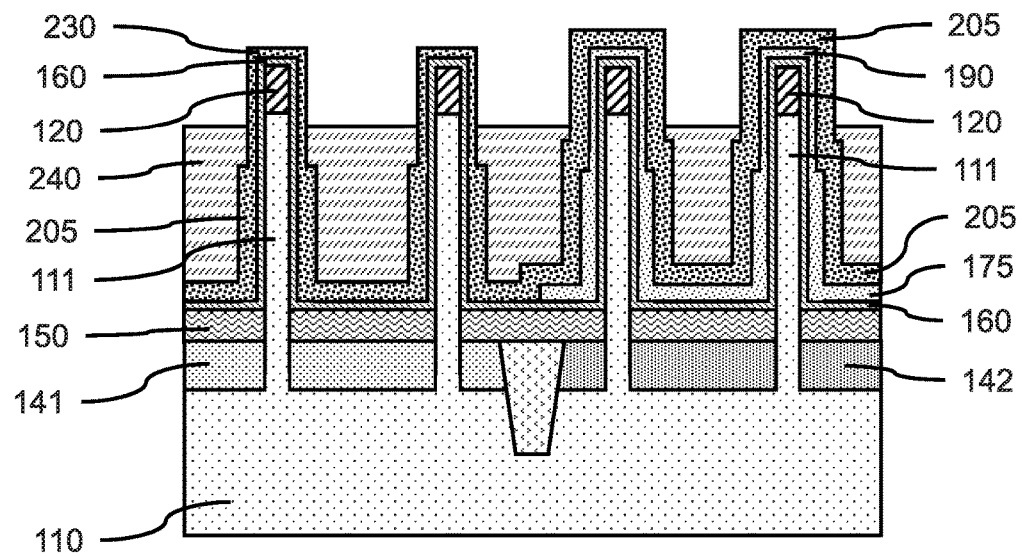
FIG. 17 is a cross-sectional side view showing a gauge layer with a reduced height exposing a portion of the work function layers on the vertical fins, in accordance with an embodiment of the present invention.

FIG. 17 is a cross-sectional side view showing a gauge layer with a reduced height exposing a portion of the work function layers on the vertical fins, in accordance with an embodiment of the present invention.

In one or more embodiments, a gauge layer 240 can be formed on the first and second regions 101, 102, and the height of the gauge layer 240 reduced. The gauge layer 240 can be etched back, for example, by a directional etch (e.g., reactive ion etch (RIE)) to a predetermined depth to exposed a predetermined portion of the fourth work function layer 230 on the vertical fins in the first region and second combined work function layer 205 on the vertical fins in the second region. The height of the gauge layer 240 can be reduced, so the top surface of the gauge layer 240 is even with or below the top surface of the vertical fins 111. The gauge layer can be a hardmask or softmask.

Figure 18:
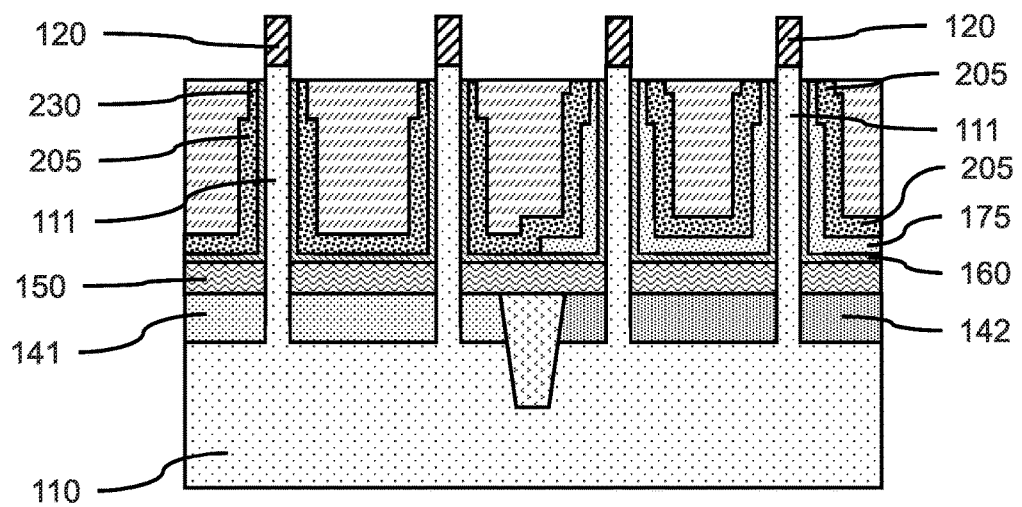
FIG. 18 is a cross-sectional side view showing the work function layers with a reduced height exposing a portion of the vertical fins and fin templates, in accordance with an embodiment of the present invention.

FIG. 18 is a cross-sectional side view showing the work function layers with a reduced height exposing a portion of the vertical fins and fin templates, in accordance with an embodiment of the present invention.

In one or more embodiments, the exposed portions of the fourth work function layer 230, second combined work function layer 205, second work function layer 190, and gate dielectric layer 160 can be removed, where the layers can be removed using selective etches. An upper portion of the vertical fins 111 and the fin templates 120 can be exposed by removing the layers. The heights of the fourth work function layer 230, second combined work function layer 205, second work function layer 190, and gate dielectric layer 160 can be reduced a predetermined amount to control the length of the fourth work function layer 230 on the upper portion of the vertical fins 111 in the first region 101 and the length of the second work function layer 190 on the upper portion of the vertical fins 111 in the second region 102. In various embodiments, the fourth work function layer 230 can cover about 10% to about 25% of the vertical fin height on the upper portion of the vertical fins 111 in the first region 101, and the second work function layer 190 can cover about 10% to about 25% of the vertical fin height on the upper portion of the vertical fins 111 in the second region 102, or the fourth work function layer 230 can cover about 10% to about 20% of the vertical fin height, and the second work function layer 190 can cover about 10% to about 20% of the vertical fin height. In various embodiments, at least 10% of the vertical fin height is covered by a second work function layer 190 or a fourth work function layer 230, where the thinner work function layers can affect the threshold voltage, Vt, near the source of the FinFET devices formed by the vertical fins 111. The vertical fins 111 can form the device channels of the NFinFETs and PFinFETs. In various embodiments, the n-type work function layer can increase the threshold voltage of the FinFET device by about 10 mV to about 200 mV depending on the work function layer thickness up to about 4 nm, where a change from about 5 Å to about 20 Å in TiN thickness can shift the Vt about 200 mV.

Figure 19:
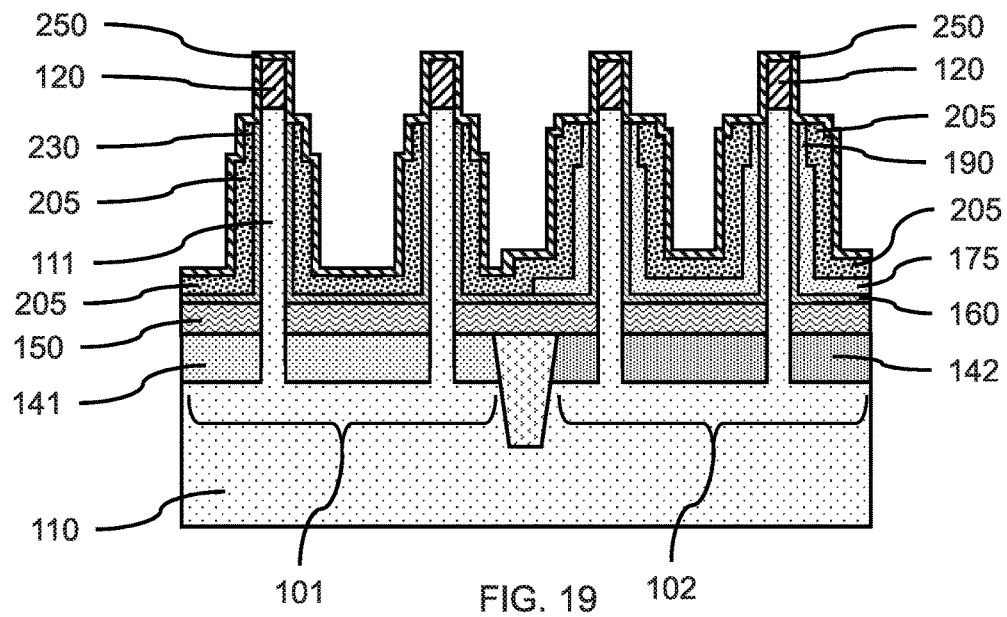
FIG. 19 is a cross-sectional side view showing an encapsulation layer on the fourth work function layer and exposed vertical fins in the first region and second region, in accordance with an embodiment of the present invention.

FIG. 19 is a cross-sectional side view showing an encapsulation layer on the fourth work function layer and exposed vertical fins in the first region and second region, in accordance with an embodiment of the present invention.

In one or more embodiments, an encapsulation layer 250 can be formed on the fourth work function layer 230, second combined work function layer 205, and exposed vertical fins 111 in the first region 101 and the second combined work function layer and exposed vertical fins in the second region 102. The encapsulation layer 250 can be a dielectric material formed by a conformal deposition. The encapsulation layer 250 can be silicon nitride (SiN), a silicon oxynitride (SiON), a silicon carbonitride (SiCN), a silicon boronitride (SiBN), a silicon borocarbide (SiBC), a silicon boro carbonitride (SiBCN), or combinations thereof. The encapsulation layer 250 can have a thickness in a range of about 5 nm to about 10 nm, or about 6 nm to about 8 nm.

Figure 20:
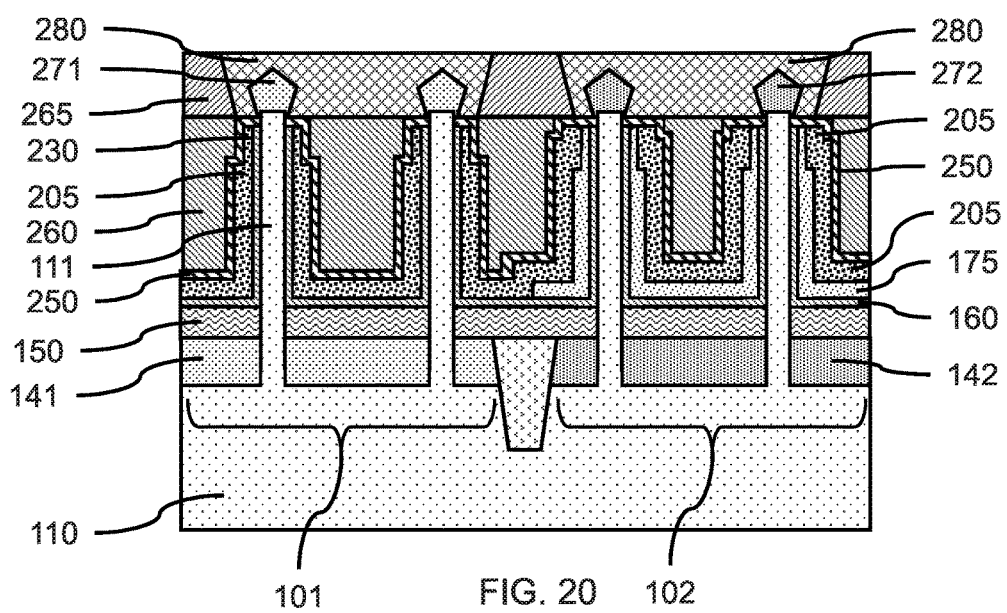
FIG. 20 is a cross-sectional side view showing top sources on the vertical fins, source contacts to the top sources, and an ILD layer on the gate structures and contacts, in accordance with an embodiment of the present invention.

FIG. 20 is a cross-sectional side view showing top sources on the vertical fins, source contacts to the top sources, and an ILD layer on the gate structures and contacts, in accordance with an embodiment of the present invention.

In one or more embodiments, an fill layer 260 can be formed on the encapsulation layer 250 on the first and second regions, where the fill layer can be a dielectric material, for example, silicon oxide (SiO), silicon nitride (SiN), a low-k dielectric material, or combinations thereof. The fill layer can be etched back to expose the fin templates 120, which can be removed.

In various embodiments, the fin templates 120 can be removed by a selective etch, and top source/drains 271, 272 can be formed on the exposed top surfaces of the vertical fins 111, where the top source/drains 271, 272 can be formed by epitaxial growth. In various embodiments, the doping of the top source/drains 271 can match the doping of the bottom source/drain region 141, and the doping of the top source/drains 272 can match the doping of the bottom source/drain region 142. The doping of top source/drains 272 can be the opposite of top source/drains 271. In various embodiments, the top source/drains 271 and bottom source/drain region 141 can be doped to form an NFET, and the top source/drains 272 and bottom source/drain region 142 can be doped to form a PFET, or the doping can be reversed. In various embodiments, two or more of top source/drains 271 and/or of top source/drains 272 can be grown to a size where the top source/drains merge to form a single top source/drain across two or more vertical fins 111. In various embodiments, the top source/drains 271, 272 are top sources and the bottom source/drain regions 141, 142 are drains.

An interlayer dielectric (ILD) layer 265 can be formed on the fill layer 260 and exposed top source/drains 271, 272. Trenches can be formed in the ILD layer 265 and top source/drain contacts 280 can be formed to the top source/drains 270. The ILD layer can be a hardmask.

Figure 21:
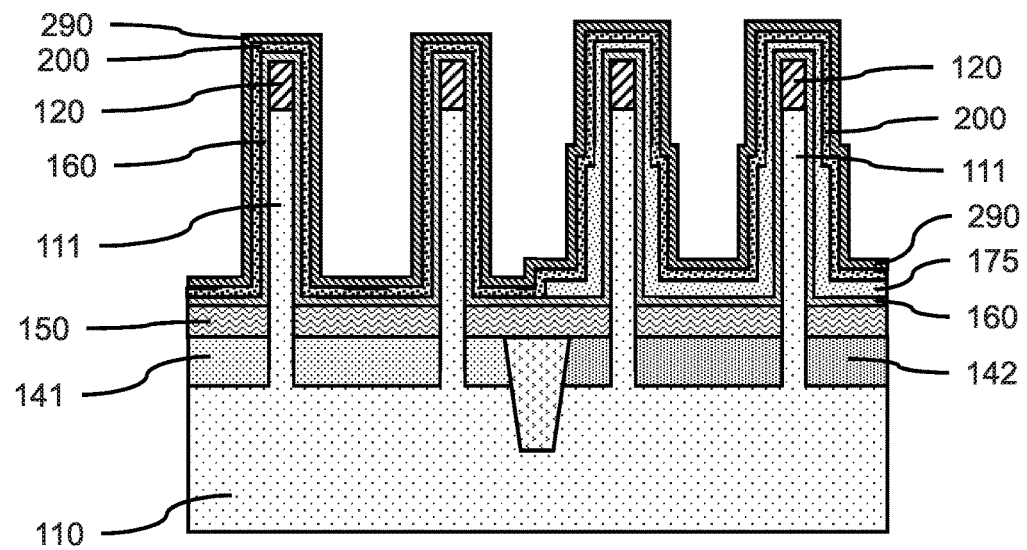
FIG. 21 is a cross-sectional side view showing a protective liner on the third work function layer on the vertical fins in the first and second regions, in accordance with another embodiment of the present invention.

FIG. 21 is a cross-sectional side view showing a protective liner on the third work function layer on the vertical fins in the first and second regions, in accordance with another embodiment of the present invention.

In another embodiment, the third work function layer 200 can be formed on the gate dielectric layer 160 in the first region 101, and on the second work function layer 190 in the second region 102. A protective liner 290 can be formed on the third work function layer 200 by a conformal deposition, where the protective liner 290 can be a hardmask material.

Figure 22:
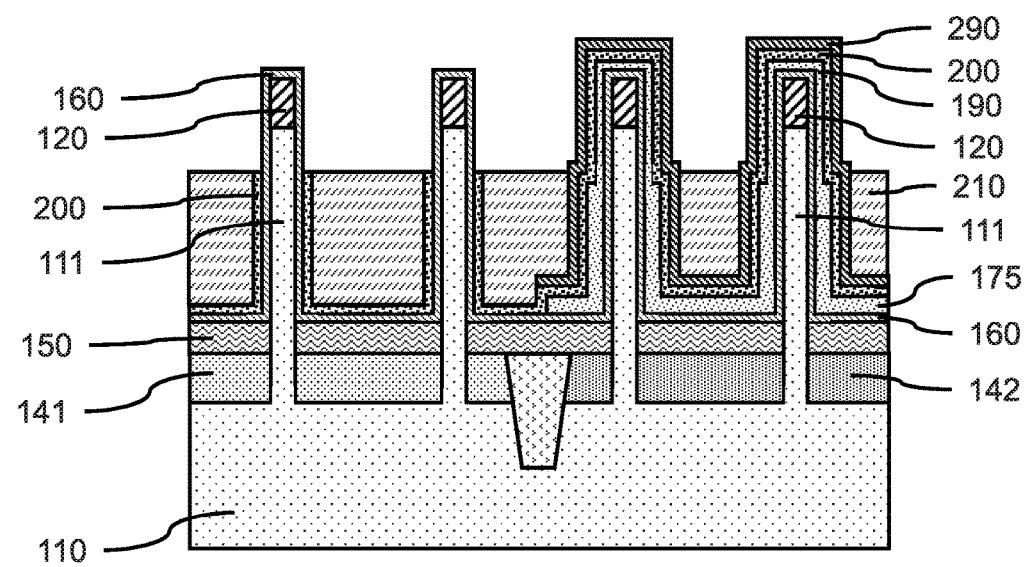
FIG. 22 is a cross-sectional side view showing a cover layer with a reduced height on the protective liner, and portions of the protective liner and third work function layer removed from the vertical fins in the first region, in accordance with another embodiment of the present invention.

FIG. 22 is a cross-sectional side view showing a cover layer with a reduced height on the protective liner, and portions of the protective liner and third work function layer removed from the vertical fins in the first region, in accordance with another embodiment of the present invention;

In various embodiments, a masking block can be formed on the vertical fins and third work function layer 200 in the second region, and expose the protective liner 290 in the first region, which can be removed. A cover layer can be formed on the third work function layer 200, and the height of the cover layer reduced to expose the predetermined height of the third work function layer 200 in the first region 101. The exposed portion of the third work function layer 200 can be removed.

Figure 23:
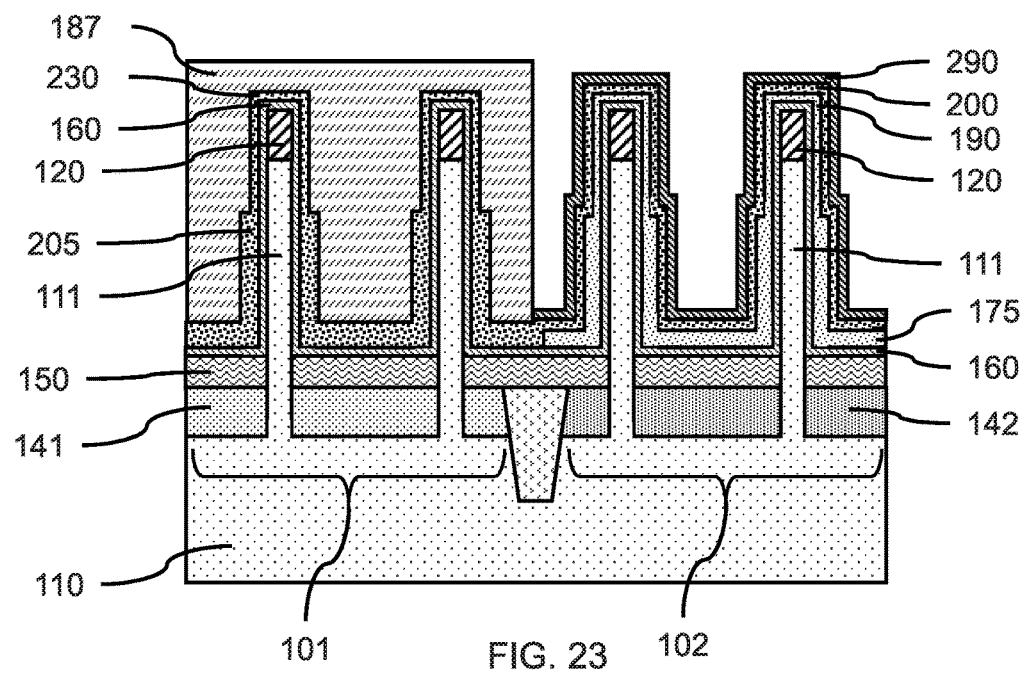
FIG. 23 is a cross-sectional side view showing a fourth work function layer formed on the third work function layer on the vertical fins in the first region, in accordance with another embodiment of the present invention.

FIG. 23 is a cross-sectional side view showing a fourth work function layer formed on the third work function layer on the vertical fins in the first region, in accordance with another embodiment of the present invention.

In another embodiments, the cover layer 210 can be removed and the fourth work function layer can be formed on the third work function layer 200 on the vertical fins in the first region 101 and the protective liner 290 in the second region 102. The first region 101 can be covered by another masking block 187, and the fourth work function layer 230 and protective liner 290 can be removed from the vertical fins 111 in the second region 102. The masking block 187 can be aligned and flush with the edge of the protective liner 290.

Figure 24:
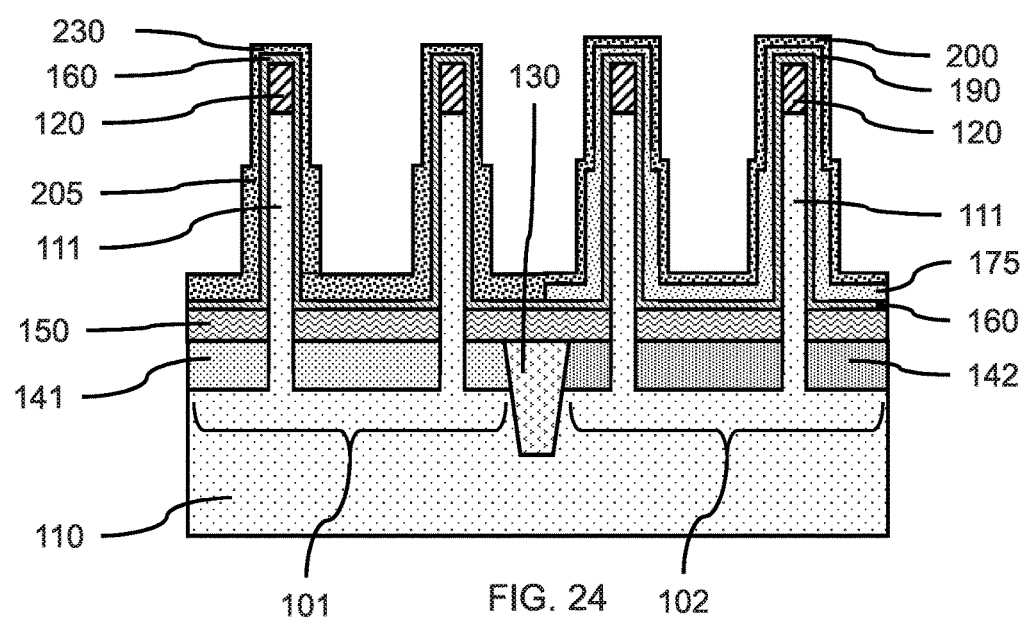
FIG. 24 is a cross-sectional side view showing a combined work function layer on the vertical fins in the first region, and the third work function layer on the vertical fins in the second region, in accordance with another embodiment of the present invention.

FIG. 24 is a cross-sectional side view showing a combined work function layer on the vertical fins in the first region, and the third work function layer on the vertical fins in the second region, in accordance with another embodiment of the present invention.

In various embodiments, the thicknesses of the third work function layer 200 and fourth work function layer can be selected to provide an essentially uniform thickness of the second combined work function layer 205 and the first combined work function layer 175 plus the thickness of the third work function layer 200, such that there is no or a minimal step at the transition from the second combined work function layer 205 to the first combined work function layer 175. This process can avoid forming extra work function material on the vertical fins in the second region 102.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A plurality of vertical fin field effect transistors, comprising:
   a first vertical fin on a first region of a substrate and a second vertical fin on a second region of the substrate;
   an isolation region between the first region and the second region;

a gate dielectric layer on the first vertical fin and the second vertical fin;

a first combined work function layer on a lower portion of the gate dielectric layer on the second vertical fin;

a second work function layer on an upper portion of the gate dielectric layer on the second vertical fin;

a second combined work function layer on a lower portion of the gate dielectric layer on the first vertical fin; and a fourth work function layer on an upper portion of the gate dielectric layer on the first vertical fin.

2. The plurality of vertical fin field effect transistors of claim 1, further comprising a first bottom source/drain region on the first region of the substrate and a second bottom source/drain region on the second region of the substrate, wherein the first bottom source/drain region is doped with an n-type dopant, and the second bottom source/drain region is doped with a p-type dopant.

3. The plurality of vertical fin field effect transistors of claim 2, wherein the third and fourth work function layers each have a thickness in the range of about 1 nm to about 10 nm.

4. The plurality of vertical fin field effect transistors of claim 3, wherein the first and second work function layers each have a thickness in the range of about 1 nm to about 10 nm.

5. The plurality of vertical fin field effect transistors of claim 4, wherein the first and second work function layers are a different work function material from the third and fourth work function layers.

6. A plurality of vertical fin field effect transistors, comprising:

a first bottom source/drain region on a first region of a substrate and a second bottom source/drain region on a second region of the substrate with an isolation region between the first region and the second region;

a first vertical fin on the first region of the substrate and a second vertical fin on the second region of the substrate;

a gate dielectric layer on the first vertical fin and the second vertical fin;

a first combined work function layer on a lower portion of the gate dielectric layer on the second vertical fin;

a second work function layer on an upper portion of the gate dielectric layer on the second vertical fin;

a second combined work function layer on a lower portion of the gate dielectric layer on the first vertical fin; and a fourth work function layer on an upper portion of the gate dielectric layer on the first vertical fin.

7. The plurality of vertical fin field effect transistors of claim 6, wherein the fourth work function layer covers about 10% to about 25% of the vertical fin height on the upper portion of the gate dielectric layer on the first vertical fin, and the second work function layer covers about 10% to about 25% of the vertical fin height on the upper portion of the gate dielectric layer on the second vertical fin.

8. The plurality of vertical fin field effect transistors of claim 7, further comprising the second combined work function layer on the second work function layer on the second vertical fin.

9. The plurality of vertical fin field effect transistors of claim 8, wherein the first and second work function layers are selected from the group consisting of titanium nitride (TiN), tantalum nitride (TaN), and ruthenium (Ru), and the third and fourth work function layers are selected from the group consisting of titanium nitride (TiN), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN), lanthanum (La) doped TiN, and lanthanum (La) doped TaN.

10. The plurality of vertical fin field effect transistors of claim 9, wherein the first bottom source/drain region is doped with an n-type dopant, and the second bottom source/drain region is doped with a p-type dopant.

* * * * *